(12) United States Patent
Hibino (10) Patent No.: US 8,605,461 B2
(45) Date of Patent: Dec. 10, 2013

(54) PHASE CURRENT DETECTION DEVICE AND POWER CONVERSION DEVICE USING THE SAME

(75) Inventor: Hiroshi Hibino, Shiga (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 13/393,562

(22) PCT Filed: Sep. 27, 2010

(86) PCT No.: PCT/JP2010/005795
§ 371 (c)(1),
(2), (4) Date: Mar. 1, 2012

(87) PCT Pub. No.: WO2011/036896
PCT Pub. Date: Mar. 31, 2011

(65) Prior Publication Data
US 2012/0163046 A1 Jun. 28, 2012

(30) Foreign Application Priority Data
Sep. 28, 2009 (JP) .................... 2009-222775

(51) Int. Cl.
*H02M 3/335* (2006.01)
*H02M 1/12* (2006.01)

(52) U.S. Cl.
USPC .......... 363/17; 363/40; 363/41; 363/95; 363/98; 363/130; 363/131; 363/132

(58) Field of Classification Search
USPC ........... 363/17, 40, 41, 95, 98, 130, 131, 132
See application file for complete search history.

(56) References Cited

U.S. PATENT DOCUMENTS

| | | | | |
|---|---|---|---|---|
| 4,772,996 A * | 9/1988 | Hanei et al. | ..................... | 363/41 |
| 6,529,393 B1 * | 3/2003 | Yu | ..................... | 363/41 |
| 6,914,409 B2 * | 7/2005 | Nukushina | ..................... | 318/800 |
| 7,583,523 B2 * | 9/2009 | Goto | ..................... | 363/98 |
| 7,598,698 B2 * | 10/2009 | Hashimoto et al. | ..................... | 318/801 |
| 7,751,210 B2 * | 7/2010 | Goto | ..................... | 363/98 |
| 8,223,521 B2 * | 7/2012 | Inoue et al. | ..................... | 363/98 |

FOREIGN PATENT DOCUMENTS

| | | |
|---|---|---|
| JP | 10-271892 A | 10/1998 |
| JP | 2004-135440 A | 4/2004 |
| JP | 2007-068260 A | 3/2007 |
| JP | 2008-048504 A | 2/2008 |
| JP | 2008-061404 A | 3/2008 |

OTHER PUBLICATIONS

Sibaprasad Chakrabarti, et al., "A Current Reconstruction Algorithm for Three-Phase Inverters Using Intergrated Current Sensors in the Low-Side Switches"; 2003 IEEE; pp. 925-932.

* cited by examiner

*Primary Examiner* — Bao Q Vu
(74) *Attorney, Agent, or Firm* — Birch, Stewart, Kolasch & Birch, LLP.

(57) ABSTRACT

A control section which repeats inverter control in units of an inverter control period having a predetermined length is provided. In the control section, a phase current detection period in which a phase current is detected is provided between predetermined two inverter control periods, each of switching states of switching elements of a inverter circuit is controlled so that a voltage pulse having a larger width than a width of a voltage pulse in the inverter control period is output from a shunt resistor in the phase current detection period.

5 Claims, 7 Drawing Sheets

| VOLTAGE VECTOR | SWITCHING STATE | | | VOLTAGE VALUE [V] OF SHUNT RESISTOR |
|---|---|---|---|---|
| | U-PHASE | V-PHASE | W-PHASE | |
| V0 | 0 | 0 | 0 | 0 |
| V1 | 0 | 0 | 1 | $I_w \times R$ |
| V2 | 0 | 1 | 0 | $I_v \times R$ |
| V3 | 0 | 1 | 1 | $-I_u \times R$ |
| V4 | 1 | 0 | 0 | $I_u \times R$ |
| V5 | 1 | 0 | 1 | $-I_v \times R$ |
| V6 | 1 | 1 | 0 | $-I_w \times R$ |
| V7 | 1 | 1 | 1 | 0 |

SWITCHING STATE "0": UPPER SIDE SWITCH IS OFF, AND LOWER SIDE SWITCH IS ON
SWITCHING STATE "1": UPPER SIDE SWITCH IS ON, AND LOWER SIDE SWITCH IS OFF

| VOLTAGE VECTOR | SWITCHING STATE | | | DETECTED VALUE | | |
|---|---|---|---|---|---|---|
| | U-PHASE | V-PHASE | W-PHASE | U-PHASE | V-PHASE | W-PHASE |
| V0 | 0 | 0 | 0 | Iu | Iv | Iw |
| V1 | 0 | 0 | 1 | Iu | Iv | W-PHASE OFFSET |
| V2 | 0 | 1 | 0 | Iu | V-PHASE OFFSET | Iw |
| V3 | 0 | 1 | 1 | Iu | V-PHASE OFFSET | W-PHASE OFFSET |
| V4 | 1 | 0 | 0 | U-PHASE OFFSET | Iv | Iw |
| V5 | 1 | 0 | 1 | U-PHASE OFFSET | Iv | W-PHASE OFFSET |
| V6 | 1 | 1 | 0 | U-PHASE OFFSET | V-PHASE OFFSET | Iw |
| V7 | 1 | 1 | 1 | U-PHASE OFFSET | V-PHASE OFFSET | W-PHASE OFFSET |

SWITCHING STATE "0": UPPER SIDE SWITCH IS OFF, AND LOWER SIDE SWITCH IS ON
SWITCHING STATE "1": UPPER SIDE SWITCH IS ON, AND LOWER SIDE SWITCH IS OFF

PHASE CURRENT DETECTION DEVICE AND POWER CONVERSION DEVICE USING THE SAME

TECHNICAL FIELD

The present invention relates to a phase current detection device configured to detect a phase current of an output alternating current from an inverter circuit, and a power conversion device using the phase current detection device.

BACKGROUND ART

There are many cases in which, in an air conditioner, an inverter circuit for converting a direct current into an alternating current is used to supply an alternating current power to a motor which drives a compressor. In general, in the inverter circuit, a phase current detection device which detects a phase current of an output alternating current is provided for the purpose of controlling a current flowing in the motor, etc. (see, for example, PATENT DOCUMENT 1). A phase current detection device of PATENT DOCUMENT 1 includes a shunt resistor provided in a DC link, and an amplifier which receives a voltage across the shunt resistor and outputs a detection current, and detects a phase current using a voltage pulse generated at the shunt resistor while PWM control (PWM: pulse width modulation) is performed.

Incidentally, the above-described inverter circuit converts a direct current into an alternating current by changing respective switching states of a plurality of switching elements. Thus, if the frequency (the carrier frequency) of a carrier signal can be increased, responsiveness of output control can be improved (i.e., a control band can be increased). To realize the foregoing, for example, the switching speed has to be increased in the PWM control inverter circuit. For example, it is expected that the carrier frequency can be increased by increasing the switching speed (for example, to a speed ten times the switching speed of a conventional inverter circuit or higher) using a switching element made of wide bandgap semiconductor.

CITATION LIST

Patent Document

PATENT DOCUMENT 1: Japanese Patent Publication No. 2004-135440

SUMMARY OF THE INVENTION

Technical Problem

However, as described above, when the carrier frequency (the switching frequency) is increased, the width of a voltage pulse generated at the shunt resistor is reduced, and thus, the operation speed of each component of the phase current detection device has to be increased. Furthermore, a voltage pulse output by the shunt resistor has a waveform which has been distorted due to ringing, etc. in a certain period from a rise, and thus, a phase current cannot be measured without waiting for a predetermined time until the voltage is stabilized. That is, when the carrier frequency is increased, it might be difficult to ensure a pulse width necessary for detecting a phase current. To solve this problem, for example, if a hall CT (current transformer) is used, detection of a phase current might be possible. However, the cost of the phase current detection device is increased, as compared to the case where the shunt resistor is used.

In view of the above-described problems, the present invention has been devised, and it is therefore an object of the present invention to realize, in a phase current detection device configured to detect a phase current of an inverter circuit using a shunt resistor, more reliable detection of a phase current even when a switching frequency of a switching element of the inverter circuit is increased to be high frequency.

Solution to the Problem

To solve the above-described problems, a first aspect of the present invention is directed to a phase current detection device for detecting a phase current of an output alternating current in an inverter circuit (3) which converts a direct current into an alternating current by changing respective switching states of a plurality of switching elements (Sup, ..., Swn). The device includes: a shunt resistor (R) configured to output a voltage pulse of a voltage corresponding the phase current; a control section (4) configured to change each of the switching states of the switching elements (Sup, ..., Swn) so that inverter control for controlling a current or a voltage generated by the output alternating current is repeated in units of an inverter control period (T2) having a predetermined length; and a detection section (5) configured to detect the phase current based on the voltage pulse, the control section (4) controls the switching states of the switching elements (Sup, ..., Swn) so that a phase current detection period (T1) in which the phase current is detected is provided between the predetermined inverter control periods (T2) and a voltage pulse having a larger width than a width of the voltage pulse in the inverter control period (T2) is output from the shunt resistor (R) in the phase current detection period (T1), and the detection section (5) detects the phase current using a voltage pulse in the phase current detection period (T1).

In this configuration, inverter control is performed and a predetermined alternating current is output in the inverter control period (T2). Moreover, according to the first aspect of the present invention, in addition to the inverter control period (T2) in which the inverter control is performed, the phase current detection period (T1) is provided, and the detection section (5) detects the phase current using the voltage pulse in the phase current detection period (T1). In this power conversion device, the waveform of the voltage pulse in the phase current detection period (T1) might be distorted by ringing in a predetermined period from a rise of the voltage pulse. However, according to the first aspect of the present invention, the control section (4) controls the switching states so that a voltage pulse having a larger width than a width of the voltage pulse during inverter control is output from the shunt resistor (R) in the phase current detection period (T1). Thus, even when detection is started after waiting until ringing stops and the voltage is stabilized, a longer detection time (i.e., a larger pulse width) than that when the voltage pulse during inverter control is used can be ensured in the phase current detection period (T1).

In a second aspect of the present invention, in the power conversion device of the first aspect, the phase current detection period (T1) is longer than the inverter control period (T2).

In this configuration, the phase current detection period (T1) is longer than the inverter control period (T2), and thus, the width of the voltage pulse in the phase current detection period (T1) can be further increased.

In a third aspect of the present invention, in the power conversion device of the first or second aspect, the shunt resistor (R) is provided between a negative direct current bus line (N) in the inverter circuit (3) and a direct current power source (2) which outputs a direct current.

In this configuration, the shunt resistor (R) is provided between the negative direct current bus line (N) and the direct current power source, and thus, phase currents (a U-phase, a V-phase, a W-phase) flow in the shunt resistor (R). That is, the phase currents (Iu, Iv, Iw) can be detected at a single shunt resistor (R).

In a fourth aspect of the present invention, in the phase current detection device of the first or second aspect, the plurality of switching elements (Sup, . . . , Swn) form a plurality of switching legs (leg1, leg2, leg3) so that each of the switching legs includes two of the switching elements (Sup, . . . , Swn), which are connected together in series, each of the switching legs (leg1, leg2, leg3) is connected between positive and negative direct current bus lines (P, N) in the inverter circuit (3), and each of respective intermediate points (M1, M2, M3) of the switching legs is connected to a load (6), and the shunt resistor (R1, R2, R3) is provided in each of the switching legs (leg1, leg2, leg3).

In this configuration, the shunt resistors (R1, R2, R3) are provided in the respective switching legs (leg1, leg2, leg3), and thus, phase currents can be simultaneously detected.

A fifth aspect of the present invention is directed to a power conversion device, and the power conversion device includes: an inverter circuit (3) which converts a direct current into an alternating current by changing respective switching states of a plurality of switching elements (Sup, . . . , Swn); and the phase current detection device of any one of the first to fourth aspects, and each of the switching elements (Sup, . . . , Swn) is made of wide bandgap semiconductor.

In this configuration, in the inverter circuit (3), switching is performed by the switching elements (Sup, . . . , Swn) each of which is made of wide bandgap semiconductor. That is, in the inverter circuit (3), the switching speed can be increased.

Advantages of the Invention

According to the first aspect of the present invention, a lager pulse width can be ensured for phase current measurement. Thus, even when the switching frequency is a high frequency, a phase current can be detected more reliably.

In general, when the switching frequency is increased, a period which can be used for phase current detection is reduced. For this reason, a period until ringing stops and the voltage is stabilized has to be reduced, and thus, the inductance of each wire has to be reduced. Therefore, in general, the higher the switching frequency is, the more consideration has to be given to wiring design of a phase current detection device. However, in the first aspect of the present invention, in addition to the inverter control period (T2), the phase current detection period (T1) is provided, and a voltage pulse having a larger width than a width of the voltage pulse during inverter control is output from the shunt resistor in the phase current detection period (T1). Thus, even when the switching frequency is increased to be higher than that in a conventional inverter circuit, a period which is long enough for ringing to stop and for the voltage to be stabilized can be provided regardless of the switching frequency. That is, in the first aspect of the present invention, a phase current can be measured using the same wiring design as that for conventional phase current detection devices. That is, according to the first aspect of the present invention, an inverter circuit which is operable at high frequency can be easily designed.

Also, since a voltage pulse having a larger width than a width of the voltage pulse during inverter control is output from the shunt resistor (R) in the phase current detection period (T1), the operation speed of the detection section (5) does not have to be increased, in particular. Therefore, a detection section used in a conventional phase current detection device can be used.

According to the second aspect, the width of the voltage pulse in the phase current detection period (T1) can be further increased. Therefore, a phase current can be detected more reliably.

According to the third aspect, phase currents can be detected at a single shunt resistor (R). Therefore, the phase current detection device can be designed to be compact.

According to the fourth aspect, phase currents can be detected simultaneously. Therefore, the number of the inserted phase current detection periods (T1) can be reduced.

According to the fifth aspect, in the inverter circuit (3) using the switching elements each of which is made of wide bandgap semiconductor, a phase current can be detected more reliably.

DESCRIPTION OF EMBODIMENTS

Hereinafter, embodiments of the present invention will be described with reference to the accompanying drawings. Note that the following embodiments are set forth merely for purposes of preferred examples in nature, and are not intended to limit the scope, applications, and use of the invention.

First Embodiment

Outline

Figure 1:
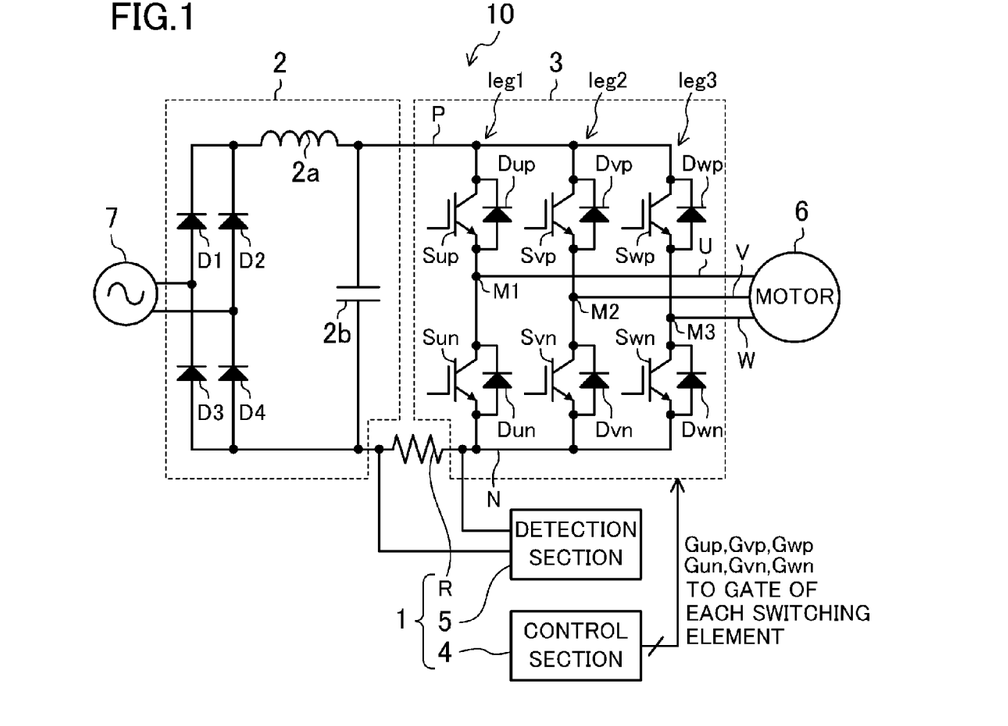
FIG. 1 is a block diagram illustrating a configuration of a power conversion device employing a phase current detection device according to a first embodiment of the present invention.

An example in which a phase current detection device according to an embodiment of the present invention is used for a power conversion device will be described below. FIG. 1 is a block diagram illustrating a power conversion device (10) employing a phase current detection device (1) according to a first embodiment of the present invention. The power conversion device (10) includes the phase current detection device (1), a converter circuit (2) (direct current power source), and an inverter circuit (3). An alternating current power source (7) is connected to the power conversion device (10), and the power conversion device (10) converts an alternating current (which will be hereinafter referred to as an "input alternating current") output by the alternating current power source (7) into a three-phase alternating current (which will be hereinafter referred to as an "output alternating current") to supply the three-phase alternating current to a motor (6) as a load. The motor (6) drives, for example, a compressor provided in a refrigerant circuit of an air conditioner.

Configuration of Each Component of Power Conversion Device

Components of the power conversion device (10) will be described in detail below.

Converter Circuit (2)

The converter circuit (2) of this embodiment includes four diodes (D1, ..., D4) bridge connected to one another, a reactor (2a), and a smoothing capacitor (2b), and performs full-wave rectification of the input alternating current. The output of the converter circuit (2) is connected to a pair of positive and negative direct current bus lines (P, N) (which will be described later) provided in the inverter circuit (3). Specifically, in the converter circuit (2), as shown in FIG. 1, the reactor (2a) is connected to a positive output of the converter circuit (2) and a positive direct current bus line (P) of the inverter circuit (3), and the smoothing capacitor (2b) is connected between the two direct current bus lines (P, N) of the inverter circuit (3).

Inverter Circuit (3)

The inverter circuit (3) is configured to change switching states of a plurality of switching elements, convert a direct current output by the converter circuit (2) into an alternating current, and supply the alternating current to the motor (6) (load). Specifically, as shown in FIG. 1, the inverter circuit (3) of this embodiment includes three switching elements (Sup, Svp, Swp) and three free-wheel diodes (Dup, Dvp, Dwp) which form an upper arm, and three switching elements (Sun, Svn, Swn) and three free-wheel diodes (Dun, Dvn, Dwn) which form a lower arm. Also, in the inverter circuit (3), a pair of positive and negative direct current bus lines (P, N) are provided, a direct current output by the converter circuit (2) is supplied to the direct bus lines (P, N).

In the inverter circuit (3), the switching elements (Sup, Svp, Swp) of the upper arm are connected in series with the switching elements (Sun, Svn, Swn) of the lower arm in one-to-one correspondence. Each of the pairs of switching elements (Sup, ..., Swn) connected in series will be hereinafter referred to as a "switching leg." In this example, a switching leg (leg1) formed of a pair of the switching element (Sup) and the switching element (Sun), a switching leg (leg2) formed of a pair of the switching element (Svp) and the switching element (Svn), and a switching leg (leg3) formed of a pair of the switching element (Swp) and the switching element (Swn) are provided.

Each of the switching legs (leg1, leg2, leg3) is connected between the positive direct current bus line (P) and the negative direct current bus line (N). Respective intermediate points (M1, M2, M3) of the switching legs (leg1, leg2, leg3) are nodes from which phase voltages (Vu, Vv, Vw) in phases (a U-phase, a V-phase, a W-phase) of an output alternating current are output, and are connected to respective phases of the motor (6).

—Selection of Switching Elements (Sup, ..., Swn)—

In the inverter circuit (3), as the switching elements (Sup, ..., Swn) of the upper arm and the lower arm, switching elements using wide bandgap semiconductor are employed. More specifically, the switching elements (Sup, ..., Swn) are SiC MOSFETs (SiC: silicon carbide). Note that in addition to SiC MOSFETs, switching elements using semiconductor containing gallium nitride (GaN) or diamond (C), etc. as a main material can be used.

Phase Current Detection Device (1)

The phase current detection device (1) is configured to detect each of phase currents (Iu, Iv, Iw) of the output alternating current, and output a current value signal indicating a detection result (a phase current value) for each of the phase currents. The current value signal can be used to control the power conversion device (10), and protect the inverter circuit (3) from an overcurrent, etc. Specifically, the phase current detection device (1) of this embodiment includes a shunt resistor (R), a control section (4), and a detection section (5).

—Shunt Resistor (R)—

The shunt resistor (R) is arranged in a position into which a current from the load (the motor (6)) flows. In this example, the shunt resistor (R) is provided between the negative direct current bus line (N) of the inverter circuit (3) and a negative node of the converter circuit (2) (more specifically, at a node located closer to the motor (6) than to the smoothing capacitor (2b)). When a current from the motor (6) flows through the shunt resistor (R), a voltage difference is generated across the shunt resistor (R), and the phase current (Iu, Iv, Iw) can be calculated by detecting a voltage across the shunt resistor (R).

—Control Section (4)—

The control section (4) generates gate signals (Gup, ..., Gwn) to be applied to gates of the switching elements (Sup, ..., Swn) of the inverter circuit (3). Then, switching states of the switching elements (Sup, ..., Swn) are transitioned to perform inverter control for controlling a current or a voltage generated by the output alternating current and control of phase current detection.

—Inverter Control—

The control section (4) repeats the inverter control in units of an inverter control period (T2) having a predetermined length. Specifically, the inverter control performed by the control section (4) is PWM control in which the voltage generated by the output alternating current is controlled in synchronization with a carrier signal. The inverter control period (T2) is equal to the cycle (carrier cycle) of the carrier signal.

The control section (4) performs switching of the switching elements (Sup, ..., Swn) at a frequency (of, for example, 50 kHz) ten times the switching frequency (i.e., the carrier frequency which is, for example, 5 kHz) in a general inverter circuit (for example, an inverter circuit using switching elements made of Si semiconductor as a main material, which will be hereinafter referred to as a "conventional inverter circuit" for convenience sake) or higher. In general, when the switching frequency is increased, a loss in the switching element is increased. However, in the inverter circuit (3) of this embodiment, as described above, since the switching elements (Sup, . . . , Swn) formed using wide bandgap semiconductor as a main material are used, the amount of increase in loss is small even when the switching frequency is increased. Thus, in the inverter circuit (3), the frequency (carrier frequency) of the carrier signal can be increased to be a high frequency as described above, thereby allowing high speed switching. Note that when PWM control is performed, an output from the shunt resistor (R) is a voltage pulse (which will be described in detail later).

—Control of Phase Current Detection—

In the inverter circuit (3), a phase current detection period (T1) in which the phase current (Iu, Iv, Iw) of the output alternating current is detected is provided between predetermined inverter control periods (T2). In the inverter circuit (3), the inverter control is repeated in units of the inverter control period (T2), the phase current detection period (T1) is provided between the inverter control period (T2) and the inverter control period (T2) at predetermined intervals (for example, 200 μsec). In this example, the phase current detection period (T1) is a period corresponding to one carrier cycle, and two consecutive phase current detection periods (T1) are inserted between the inverter control periods (T2). The control section (4) controls switching states of the switching elements (Sup, . . . , Swn) so that in a first half (a first period) of the two phase current detection periods (T1), a voltage pulse corresponding to a U-phase current (Iu) is output from the shunt resistor (R), and in a latter half (a second period) thereof, a voltage pulse corresponding to a V-phase current (Iv) is output from the shunt resistor (R).

In this case, the control section (4) controls the switching states of the switching elements (Sup, . . . , Swn) so that a voltage pulse having a larger pulse width than that of a voltage pulse in the inverter control period (T2) is output from the shunt resistor (R) in the phase current detection period (T1). Specifically, it is preferable that the pulse width of each voltage pulse in this period is substantially equal to a width of a voltage pulse generated at a shunt resistor in the conventional inverter circuit. Thus, in the detection section (5) having a similar configuration to that of a conventional one, a voltage difference can be detected (details will be described later). Note that specific switching states in the first and second periods will be described in the section of <<Operation of Power Conversion Device (10)>> below.

—Detection Section (5)—

Figure 2:
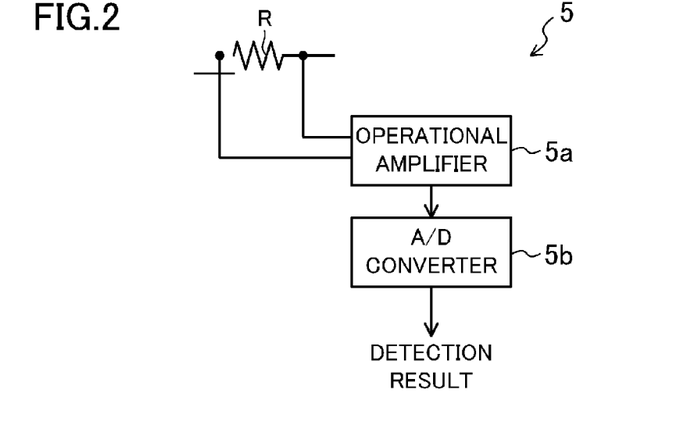
FIG. 2 is a block diagram illustrating an example configuration of a detection section.

After a predetermined time which is long enough for ringing generated on a voltage pulse to stop has elapsed since a rise of a voltage pulse generated at the shunt resistor (R) in the phase current detection period (T1), the detection section (5) detects a voltage value of the voltage pulse, obtains a phase current from the detected value and a resistance value of the shunt resistor (R), and outputs a result of the detection. FIG. 2 is a block diagram illustrating an example configuration of the detection section (5). In this example, the detection section (5) includes an operational amplifier (5a) configured to receive a voltage pulse output by the shunt resistor (R) and an A/D converter (5b) configured to A/D convert an output of the operational amplifier (5a).

Operation of Power Conversion Device (10)

Operation in Inverter Control Period (T2)

Figure 3:
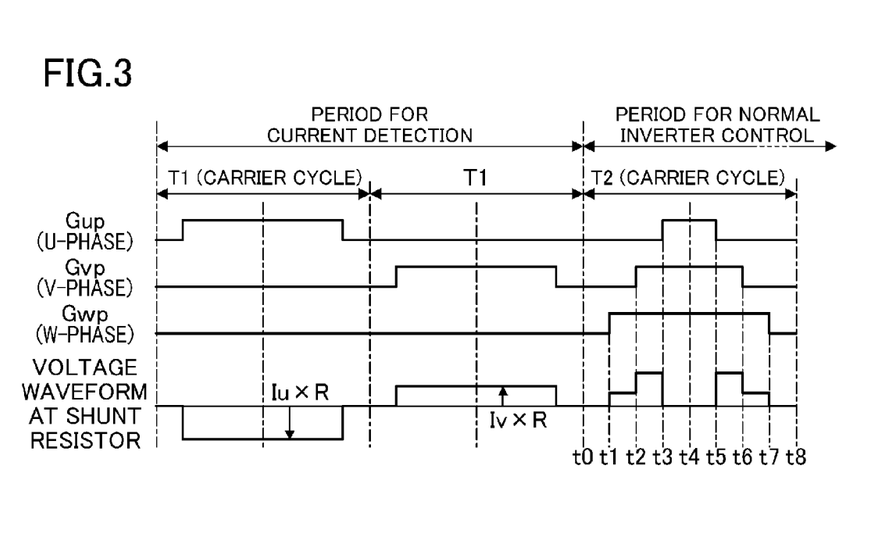
FIG. 3 is a chart illustrating waveforms of gate signals given to gates of switching elements at an upper arm side and a voltage waveform at a shunt resistor.

The pattern (waveform) of a gate voltage which the control section (4) applies to each of the switching elements (Sup, . . . , Swn) during PWM control is similar to that during PWM control performed in the conventional inverter circuit. However, as described above, in the inverter circuit (3), the carrier frequency during the PWM control is higher than that in the conventional inverter circuit. FIG. 3 is a chart illustrating waveforms of gate signals given to gates of the switching elements (Sup, Svp, Swp) at an upper arm side and a voltage waveform at the shunt resistor (R). This chart shows that, when the gate signals (Gup, Gyp, Gwp) are at high level, the switching elements at the upper arm side corresponding to the signals are on, and the respective switching elements at a lower arm side which make pairs with the switching elements at the upper arm side are off. It also shows that, on the contrary, when the gate signals (Gup, Gyp, Gwp) are at low level, the switching elements at the upper arm side corresponding to the gate signals are off, and the respective switching elements at the lower arm side which make pairs with the switching elements at the upper arm side are on.

In the example of FIG. 3, for the switching leg (leg1) corresponding to the U-phase, the control section (4) outputs a gate signal (Gup) with a rectangular wave, thereby controlling the switching element (Sup) at the upper arm side so that the switching element (Sup) is turned on in a period from t3 to t5 in the inverter control period (T2), and is turned off in other periods in the inverter control period (T2). For the switching leg (leg2) corresponding to the V-phase, the control section (4) controls the switching element (Svp) at the upper arm side so that the switching element (Svp) is turned on in a period from t2 to t6 in the inverter control period (T2), and is turned off in other periods in the inverter control period (T2). For the switching leg (leg3) corresponding to the W-phase, the control section (4) controls the switching element (Swp) at the upper arm side so that the switching element (Swp) is turned on in a period from t1 to t7 in the inverter control period (T2), and is turned off in other periods in the inverter control period (T2).

Note that in this inverter control, the on/off state of each of the switching elements (Sun, Svn, Swn) at the lower arm side is in an opposite relation to that of an associated one of the switching elements at the upper arm side. For example, the control section (4) controls the switching element (Sun) at the lower arm side corresponding to the U-phase so that the switching element (Sun) is turned off when the switching element (Sup) is on, and is turned on when the switching element (Sup) is off.

By the above-described control, as shown in FIG. 3, all of the switching elements (Sup, Svp, Swp) at the upper arm side are turned off in a period from t0 to t1, and in this case, the magnitude of a current at the shunt resistor (R) is zero. Therefore, a voltage is not generated across the shunt resistor (R). Also, in a period from t1 to t2, the switching element (Swp) at the upper arm side and the two switching elements (Sun, Svn) at the lower arm side are controlled to be on, and the other switching elements at the upper arm side and the lower aim side are controlled to be off Accordingly, a phase current (Iw) flows in the shunt resistor (R). Similarly, in a period from t2 to t3, the two switching elements (Svp, Swp) at the upper arm side and the switching element (Sun) at the lower arm side are controlled to be on, and the other switching elements at the upper arm side and the lower arm side are controlled to be off. Accordingly, a current having a magnitude of (Iv+Iw), i.e., a current of (−Iu) flows in the shunt resistor (R). The phase current flowing in the shunt resistor (R) is a pulse current corresponding to the above-described waveform, and a voltage pulse is generated across the shunt resistor (R). Similarly, a voltage pulse is generated across the shunt resistor (R) in each of a period from t5 to t6 and a period from t6 to t7.

In the conventional inverter circuit, a phase current is detected from the level of a voltage pulse generated at a shunt resistor during inverter control in the above-described manner. However, in this embodiment, it is difficult to detect a phase current from a voltage pulse generated in this period. That is, in the inverter circuit (3), the carrier frequency is ten times the carrier frequency in the conventional inverter circuit or higher, and therefore, the width of the voltage pulse in the inverter control period (T2) is equal to or less than 1/10 of that in the conventional inverter circuit. Moreover, although not shown in FIG. 3, the waveform of the voltage pulse is distorted by ringing in a predetermined period from a rise of the voltage pulse. Therefore, in the inverter control period (T2), it is difficult to ensure a sufficient pulse width for measurement after a voltage pulse is stabilized. That is, when the carrier frequency is increased as in this embodiment, it is difficult to detect a phase current (Iu, Iv, Iw) from a voltage pulse generated at the shunt resistor (R) during inverter control as in the conventional inverter circuit.

Operation in Phase Current Detection Period (T1)

In the phase current detection period (T1), the control section (4) controls, in the first period, each of the switching elements so that the switching element (Sup) at the upper arm side is turned on, the switching element (Svn) and the switching element (Swn) at the lower arm side are turned on, and the other switching elements at the upper arm side and the lower arm side are turned off. Accordingly, in the first period, a U-phase current (Iu) flows in the shunt resistor (R). The U-phase current (Iu) is also a pulse current, and a voltage pulse is generated across the shunt resistor (R). The waveform of the voltage pulse is also distorted by ringing in a predetermined period from a rise of the voltage pulse.

However, the voltage pulse is controlled so that the width thereof is larger than that of a voltage pulse in the inverter control period (T2). Thus, even when detection is started after waiting until ringing stops and the voltage is stabilized, the detection section (5) can ensure a sufficiently longer time for measuring a phase current than that when a voltage pulse during an inverter control is used. Therefore, even after the voltage pulse rises, and then, ringing stops and the voltage of the voltage pulse is stabilized, a sufficient pulse width for measurement can be ensured. Then, after a lapse of an enough time for ringing to stop from a rise of the voltage pulse, the detection section (5) obtains the U-phase current (Iu) from the level of the voltage pulse and a resistance value of the shunt resistor (R), and outputs a detection result. Thus, the detection section (5) can detect a phase current more reliably.

Similarly, in the second period, the control section (4) controls each of the switching elements so that the switching element (Svp) at the upper arm side is turned on, the two switching elements (Sun) and (Swn) at the lower arm side are turned on, and the other switching elements at the upper arm side and the lower arm side are turned off Thus, in the second period, a V-phase current (Iv) flows in the shunt resistor (R). Also, in this period, after a lapse of a predetermined time from a rise of the voltage pulse, the detection section (5) obtains the V-phase current (Iv) from the level of the voltage pulse and a resistance value of the shunt resistor (R), and outputs a detection result. In the second period, the voltage pulse is also controlled so that the width of the voltage pulse is larger than that of a voltage pulse in the inverter control period (T2). Thus, even when detection is started after waiting until ringing stops and the voltage is stabilized, a longer time for measuring a phase current than that when the voltage pulse during an inverter control is used can be ensured.

After completing the measurement of each of the U-phase and V-phase currents (Iu, Iv), the detection section (5) calculates a W-phase current (Iw) using the relational expression of Iw=−(Iu+Iv), and outputs an obtained value. Thus, the phase currents (Iu, Iv, Iw) of the three phases have been detected.

Advantages of this Embodiment

As described above, according to this embodiment, even when the switching frequency (carrier frequency) of the switching elements (Sup, . . . , Swn) is higher than that in the conventional inverter circuit, a phase current (Iu, Iv, Iw) of each phase can be more reliably detected in the detection section (5). Note that, as described above, when there is the phase current detection period (T1) in which inverter control is not performed, the output voltage is fixed during the phase current detection period (T1). However, as in this embodiment, when the motor (6) is connected as a load, the phase current detection period (T1) is sufficiently shorter than a time constant of the motor (6). Thus, the current waveform is not greatly different from a desired waveform and no practical problem is caused.

Also, in the conventional inverter circuit, when the switching frequency is increased, a period which can be used for phase current detection is reduced. Therefore, a period until ringing stops and the voltage is stabilized has to be reduced, and thus, the inductance of each wiring has to be reduced. For this reason, in the conventional inverter circuit, when the switching frequency is increased as in this embodiment, consideration has to be given to wiring design. However, in this embodiment, in addition to the inverter control period (T2), the phase current detection period (T1) is provided, and in the phase current detection period (T1), a voltage pulse having a larger pulse width than that of a voltage pulse during an inverter control is output from the shunt resistor (R). Thus, even when the switching frequency is increased to be higher than that in the conventional inverter circuit, regardless of the switching frequency, a period until ringing stops and the voltage is stabilized can be provided. Therefore, according to this embodiment, measurement of a phase current using a similar wiring design to a conventional one can be realized. That is, an inverter circuit which is operable at high frequency can be easily designed by using the phase current detection device (1) of this embodiment.

Moreover, a voltage pulse having a sufficient pulse width can be obtained in the phase current detection period (T1), and thus, even when the switching frequency is increased, the operation speed of each element forming the phase current detection device (1) does not have to be increased. For example, in this embodiment, increase in operation speed of the A/D converter (5b) of the detection section (5), etc. is not necessarily required, and a similar A/D converter to an A/D converter of a detection section in the conventional inverter circuit can be employed. That is, increase in costs required for increasing the switching speed can be avoided.

In the example of FIG. 3, in detecting a phase current, control is performed so that switching of the switching elements corresponding to the U-phase and switching of the switching elements corresponding to the V-phase are not performed simultaneously. However, control may be performed so that switching of the switching elements corresponding to the U-phase and switching of the switching elements corresponding to the V-phase are performed simultaneously.

First Variation of First Embodiment

Note that, in addition to the above-described detection of the U-phase and V-phase current, a value of a W-phase current may be actually detected. To realize this, for example, the phase current detection period (T1) may be further inserted, and the value of the W-phase current may be directly detected in the inserted period. To detect the W-phase current value, the control section (4) controls each of the switching elements so that the switching element (Swp) at the upper arm side is turned on, the two switching elements (Sun) and (Svn) at the lower arm side are turned on, and the other switching elements at the upper arm side and the lower arm side are turned off.

For example, when any one of waveforms of voltage pulses of two phases which are actually detected is distorted, a value of a phase current (the phase current (Iw) in the above-described example) obtained by calculation is not accurate. In contrast, phase currents can be obtained more accurately by detecting current values of all of three phases. Also, when the phase current detection period (T1) is provided for each of the three phases, an average value of output voltage can be caused to be zero in each of the phase current detection periods (T1) for the three phases, so that imbalance of output voltages of three phases is not caused.

Second Variation of First Embodiment

Figure 4:
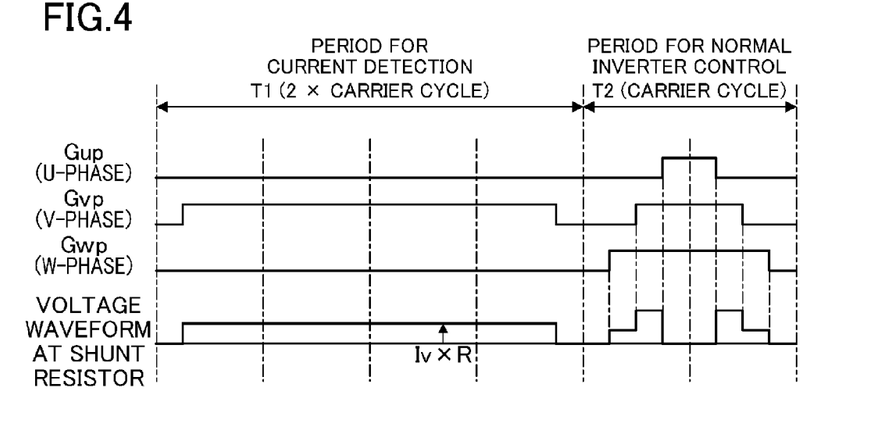
FIG. 4 is a chart illustrating waveforms of gate signals given to gates of switching elements at an upper arm side and a voltage waveform at a shunt resistor by a phase current detection device according to a second variation of the first embodiment.

For example, when the carrier frequency is increased to be an even higher frequency, and a sufficient voltage pulse width cannot be ensured in the phase current detection period (T1) corresponding to one carrier cycle, the phase current detection period (T1) may be set to be longer than one carrier cycle. FIG. 4 is a chart illustrating waveforms of gate signals (Gup, Gyp, Gwp) given to respective gates of the switching elements (Sup, Svp, Swp) at the upper arm side by a phase current detection device and a voltage waveform at the shunt resistor (R) according to a second variation of the first embodiment. In this example, as shown in FIG. 4, as the phase current detection period (T1) in which a single phase current is detected, a period corresponding to two carrier cycles is used. Note that in the example of FIG. 4, the waveforms of gate signals in measuring a V-phase current (Iv) are shown, and the control section (4) outputs the gate signal (Gyp) in the phase current detection period (T1).

Third Variation of First Embodiment

Figure 5:
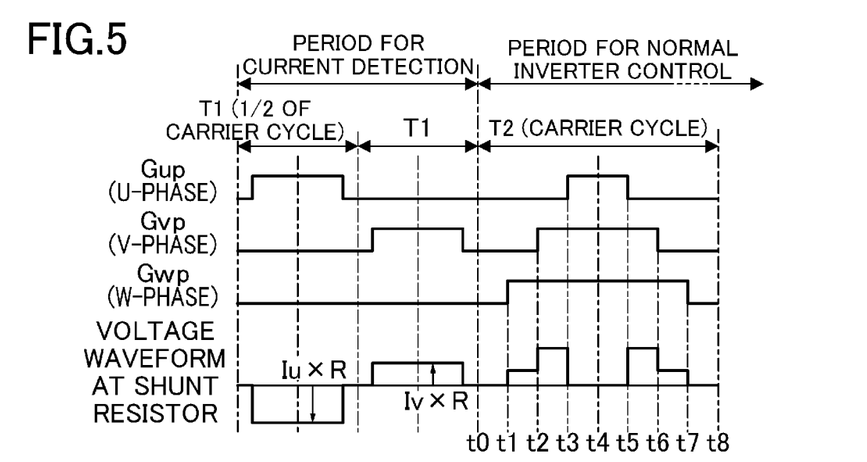
FIG. 5 shows an example where a phase current detection period is set to be 0.5 carrier cycles.

When a detection time for each phase current may be shorter than one carrier cycle, the phase current detection period (T1) may be set shorter than that in the first embodiment, etc. FIG. 5 shows an example where the phase current detection period (T1) is set to be 0.5 carrier cycles.

Second Embodiment

Figure 6:
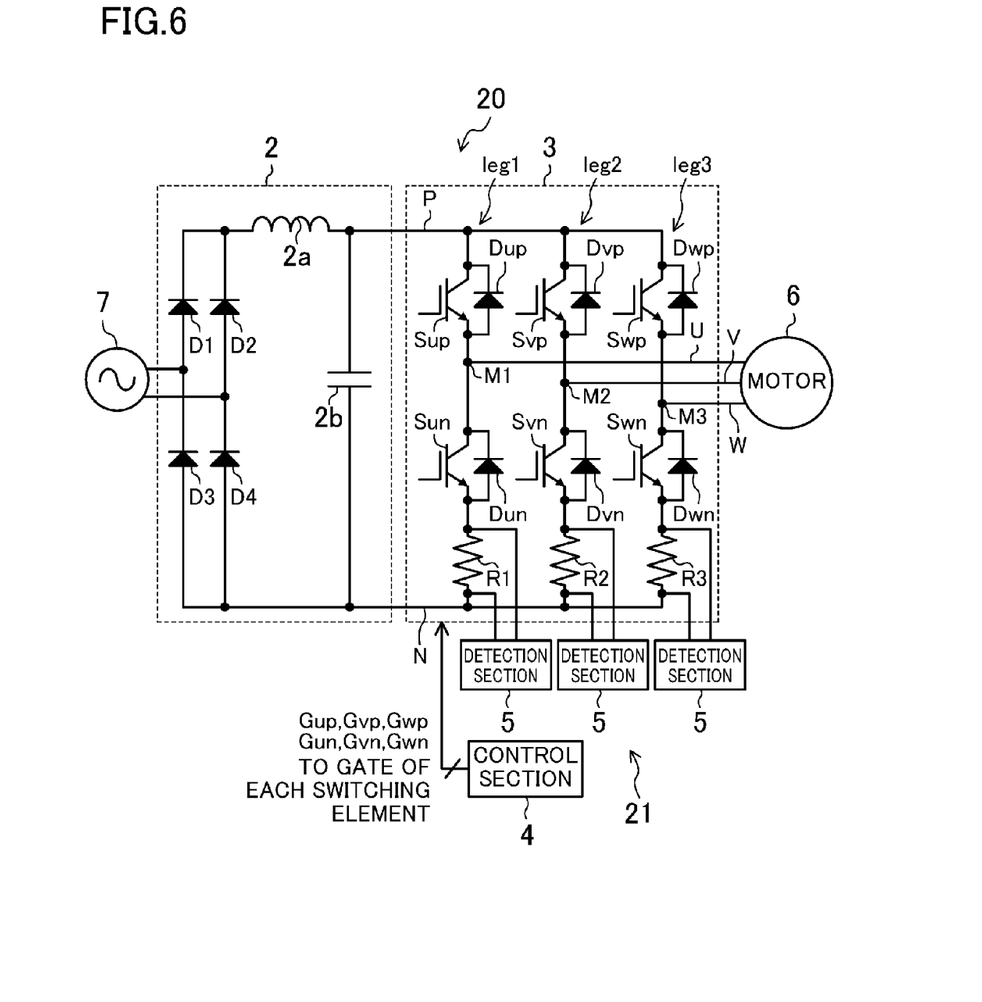
FIG. 6 is a block diagram illustrating a configuration of a power conversion device employing a phase current detection device according to a second embodiment of the present invention.

FIG. 6 is a block diagram illustrating a configuration of a power conversion device (20) employing a phase current detection device (21) according to a second embodiment of the present invention. In the phase current detection device (21), the number and arrangement of shunt resistors and the configuration of each of a control section (4) and a detection section (5) are different from those in the power conversion device (10) of the first embodiment.

Specifically, the phase current detection device (21) includes three shunt resistors (R1, R2, R3), and the shunt resistors (R1, R2, R3) are arranged in the switching legs (leg1, leg2, leg3) in one-to-one correspondence. More specifically, the shunt resistor (R1) is arranged between a switching element (Sun) and a direct current bus line (N) in the switching leg (leg1), the shunt resistor (R2) is arranged between a switching element (Svn) and the direct current bus line (N) in the switching leg (leg2), and the shunt resistor (R3) is arranged between a switching element (Swn) and the direct current bus line (N) in the switching leg (leg3). That is, a U-phase current (Iu), a V-phase current (Iv), and a W-phase current (Iw) flow in the shunt resistor (R1), the shunt resistor (R2), and the shunt resistor (R3), respectively.

In this embodiment, three detection sections (5) are provided to correspond to the shunt resistors (R1, R2, R3). Each of the detection sections (5) has a similar configuration to that of the detection section (5) of the first embodiment, and is configured to detect a voltage pulse of an associated one of the shunt resistors (R1, R2, R3) and obtain a phase current (Iu, Iv, Iw) of an associated one of the phases.

Similar to the first embodiment, the control section (4) controls respective switching states of the switching elements (Sup, . . . , Swn) separately in the inverter control period (T2) and the phase current detection period (T1). However, the control section (4) of this embodiment controls the switching states in the phase current detection period (T1) in a different manner from that in the first embodiment. The switching state control will be described later. Note that in this embodiment, the phase current detection period (T1) is a period corresponding to one carrier cycle, and the control section (4) controls the switching states of the switching elements (Sup, . . . , Swn) so that the width of a voltage pulse generated at each of the shunt resistors (R1, R2, R3) is larger in the phase current detection period (T1) than the width of the voltage pulse in the converter circuit (2).

Operation of Power Conversion Device (20)

The operation of the power conversion device (20) in the inverter control period (T2) in this embodiment is similar to that of the power conversion device (10) in the first embodiment.

On the other hand, in the phase current detection period (T1), the control section (4) turns on all of three switching elements (Sun, Svn, Swn) at the lower arm side. Thus, a U-phase current (Iu), a V-phase current (Iv), and a W-phase current (Iw) flow in the resistance element R1, the resistance element R2, and the resistance element R3, respectively. At this time, a voltage pulse is generated across each of the shunt resistors (R1, R2, R3). The waveform of each of the voltage pulses is also distorted by ringing in a predetermined period from a rise of the voltage pulse. Then, after a lapse of an enough time for ringing to stop from the rise of the voltage pulse, the detection section (5) obtains the phase currents (Iu, Iv, Iw) from the respective levels of the voltage pulses and respective resistance values of the shunt resistors (R1, R2, R3), and outputs detection results.

In this embodiment, each of the voltage pulses is controlled so that the width of each of the voltage pulses is larger in the phase current detection period (T1) than that of a corresponding voltage pulse in the inverter control period (T2). Thus, even when detection is started after waiting until ringing stops and the voltage is stabilized, the detection section (5) can ensure a longer time for measuring a phase current than that when the voltage pulse in an inverter control is used.

Thus, also in this embodiment, a phase current (Iu, Iv, Iw) of each phase can be detected more reliably in the detection section (5). Moreover, three phase currents can be detected simultaneously, and thus, the number of the inserted phase current detection periods (T1) can be reduced.

Note that also in this embodiment, when the carrier frequency is increased to be an even higher frequency, and a sufficient voltage pulse width cannot be ensured in a period corresponding to one carrier cycle, the phase current detection period (T1) may be set to be longer than one carrier cycle (for example, 2×a period corresponding to one carrier cycle) as in the second variation of the first embodiment.

Third Embodiment

Figure 7:
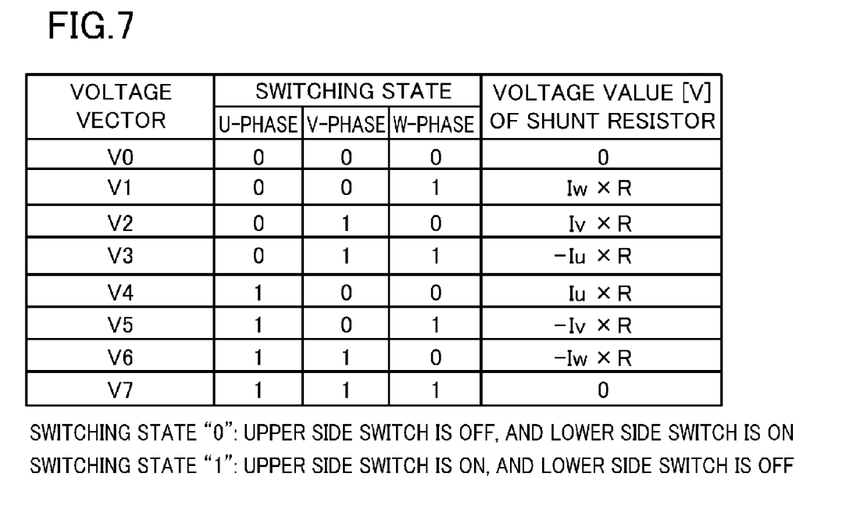
FIG. 7 is a table showing the relationship between voltage vectors and respective switching states of switching elements.

In a third embodiment, example switching patterns during phase current detection will be described. Note that respective switching patterns of the switching elements (Sup, . . . , Swn) will be represented by voltage vectors below. FIG. 7 is a table showing the relationship between voltage vectors V0-V7 and the respective switching states of switching elements (Sup, . . . , Swn). Note that the voltage values of the shunt resistors shown in FIG. 7 are examples of values obtained when a single shunt resistor is used for current detection as in the power conversion device (10) of the first embodiment.

Switching Pattern Example 1

In the example of FIG. 3 described in the first embodiment, a current is detected using V4 (100) and V2 (010), and thus, the output voltage of the inverter circuit (3) is reduced. In the switching pattern example 1, a switching pattern example which can prevent reduction in an output voltage will be described.

Figure 8:
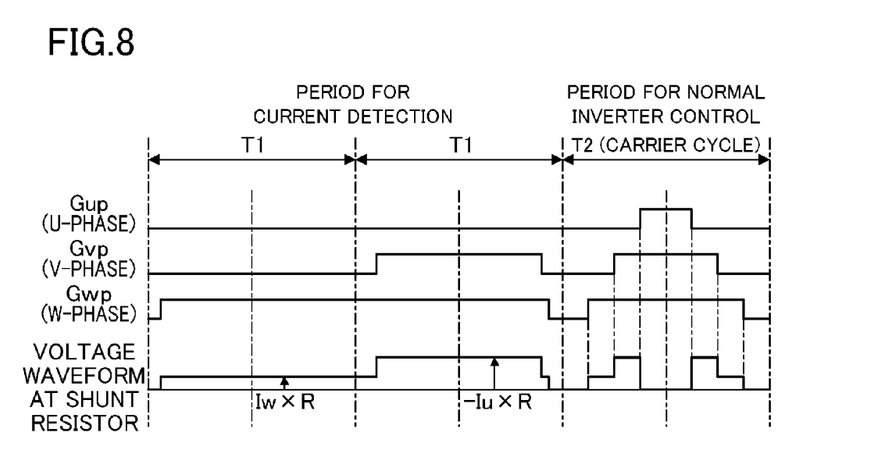
FIG. 8 shows an example switching pattern which can prevent reduction in an output voltage of an inverter circuit.

FIG. 8 shows an example switching pattern which can prevent reduction in an output voltage of the inverter circuit (3). As shown in FIG. 8, when the voltage vectors used for inverter control are V0 (000), V1 (001), V3 (011), and V7 (111), current detection processing is performed using V1 (001) and V3 (011) which are non-zero vectors. That is, the same voltage vectors as those used for inverter control are output in a period in which phase current detection is performed. Thus, it is possible to prevent reduction in an output voltage of the inverter circuit (3) in a phase current detection period.

Note that in the example of FIG. 8, the switching timings for switching elements corresponding to the V-phase and the W-phase are caused to be different. This is because noise might be generated if the switching timings thereof are the same. However, if such noise does not cause any problem, the switching timings thereof may be set to be the same.

Switching Pattern Example 2

Figure 9:
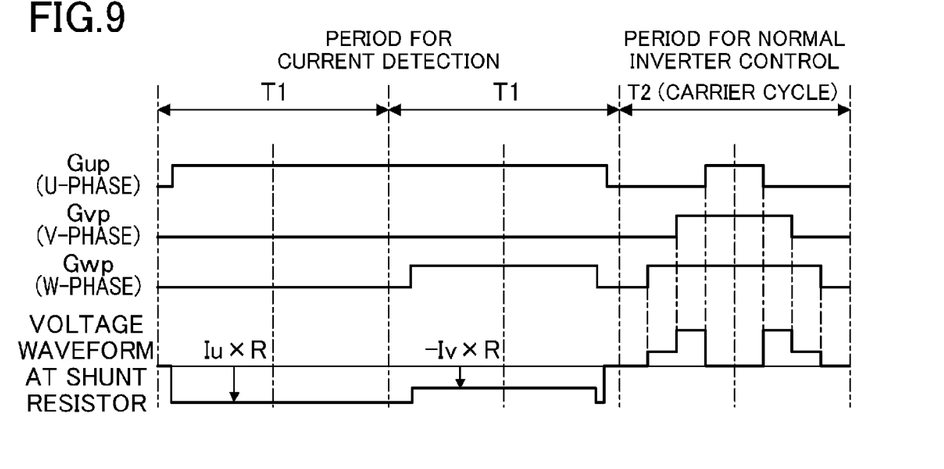
FIG. 9 shows an example switching pattern which can prevent increase in an output current of the inverter circuit.

In a switching pattern example 2, a switching pattern example which can prevent increase in an output current will be described. FIG. 9 shows an example switching pattern which can prevent increase in an output current of the inverter circuit (3). In the example of FIG. 9, |Iu|>|Iv|>|Iw|,Iu<0, Iv>0, and Iw>0.

In this example, for the U-phase, "1" is selected as the switching state for switching elements of the U-phase to reduce |Iu|, since |Iu| is the largest. For the V-phase, "0" is selected as the switching state for switching elements of the V-phase to reduce |Iv|, since |Iv| is the second largest. For the W-phase, "0" and "1" are selected so that currents of two phases can be detected, since |Iw| is the smallest. Note that in this switching pattern selection, previously detected Iu, Iv, and Iw may be used, and as another option, estimated Iu, Iv, and Iw may be used. Thus, it is possible to prevent increase in an output current in a phase current detection period, so that an abnormal stop and destruction of the inverter circuit (3) can be prevented.

Switching Pattern Example 3

Figure 10:
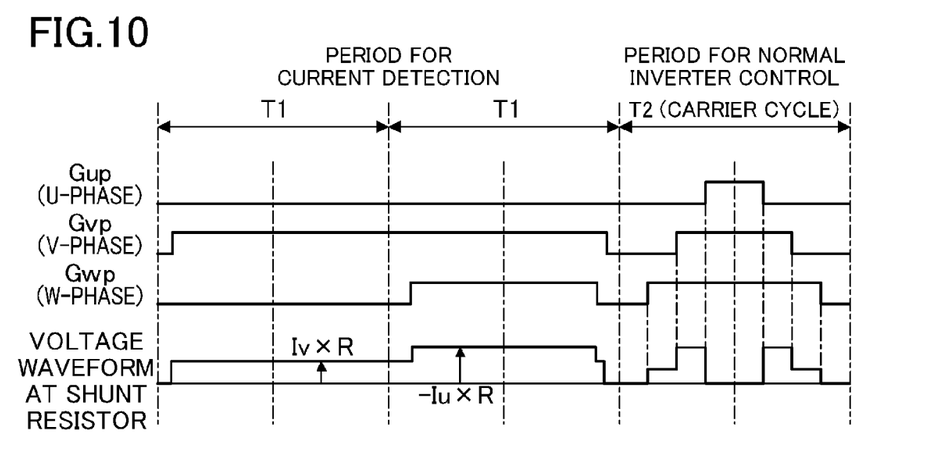
FIG. 10 shows an example switching pattern which can cause a voltage pulse to be positive at all times.

In a switching pattern example 3, a switching pattern example which can cause a voltage pulse to be positive at all times. FIG. 10 shows an example switching pattern which can cause a voltage pulse to be positive at all times. In the example of FIG. 10, |Iu|>|Iv|>|Iw|, Iu<0, Iv>0, and Iw>0.

In this example, Iu and Iv whose absolute values are large are selected. Specifically, for voltage vectors, a voltage vector V3 with which −Iu can be detected is selected, since Iu is negative, and a voltage vector V2 with which Iv can be detected is selected, since Iv is positive. In this switching pattern selection, previously detected Iu, Iv, and Iw may be used, and as another option, estimated Iu, Iv, and Iw may be used.

Note that a reason why Iw whose absolute value is the smallest is not detected is that the magnitude of each phase current is determined based on the previously detected values, etc., and a sign of Iw which is the closest to zero might be changed.

In this switching pattern, as a detection circuit which detects a voltage across a shunt resistor, a detection circuit can be configured to be capable of detecting only positive voltages. Thus, a voltage resolution is increased. For example, when detection of a voltage in the range of −1 V to 1 V is performed using a 10 bit A/D converter, the voltage resolution is $2/2^{10}=1.95$ mV/bit. In contrast, when a voltage in the range of 0 V to 1 V is detected (only a positive voltage is detected), the voltage resolution is $1/2^{10}=0.977$ mV/bit, and the voltage resolution is increased.

Fourth Embodiment

In the fourth embodiment, an example phase current detection device which can perform voltage offset compensation (which will be hereinafter referred to as "offset compensation") for a shunt resistor will be described. Specifically, in the first embodiment (including the variations) or the second embodiment, a switching pattern with which a phase current (motor current) does not flow in a shunt resistor is selected, a voltage at the time is detected (offset detection), and offset compensation is performed using a detected value (offset detection value).

Specifically, in a phase current detection device including a single shunt resistor (for example, the first embodiment), voltage vectors V0 and V7 are selected.

Figure 11:
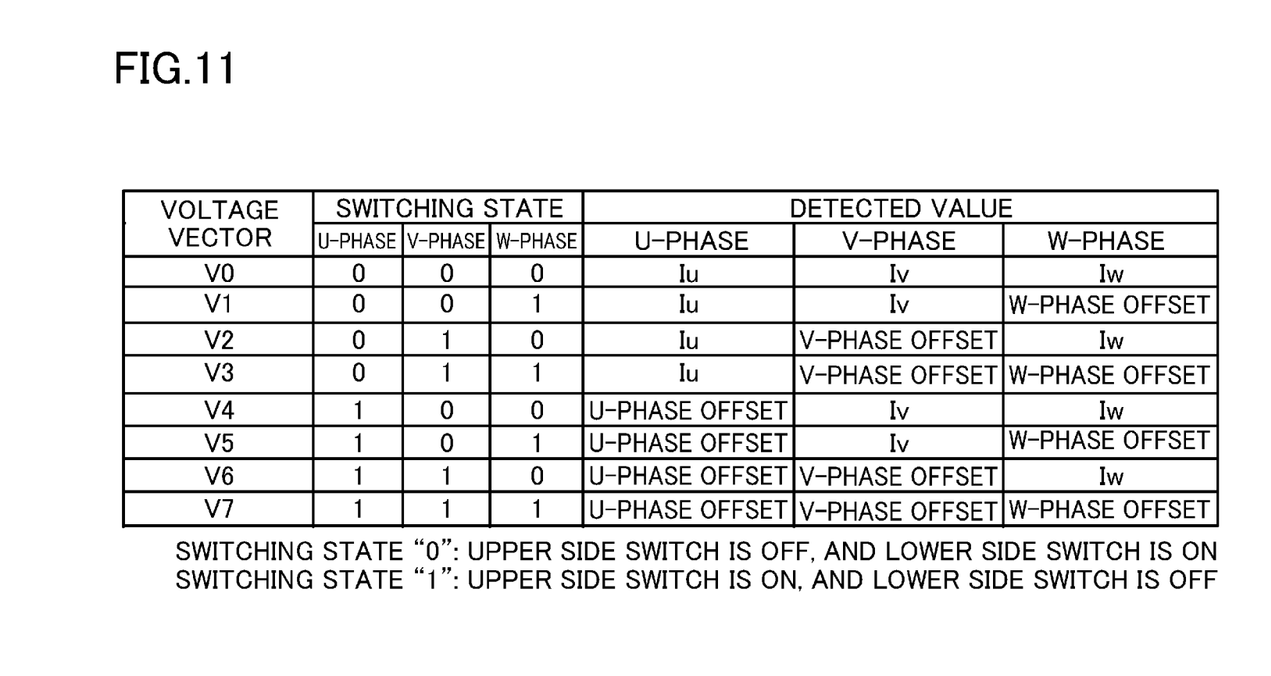
FIG. 11 is a table showing the relationship between switching states and values detected using shunt resistors in a phase current detection device including three shunt resistors.

In a phase current detection device including three shunt resistors (for example, the second embodiment, etc.), the switching state for switching element of a phase for which offset compensation is performed is set to be "1" (the switching element at the upper arm side is turned on, and the switching element at the lower arm side is turned off). FIG. 11 is a table showing the relationship between switching states in a phase current detection device including three shunt resistors and detected values by the shunt resistors. For example, when offset detection for three phases is performed simultaneously, the voltage vector V7 (111) is selected. When phase current detection and offset detection are performed simultaneously, a non-zero vector which has the largest pulse width in normal inverter control is used. Specifically, voltage vectors V1-V6 are used. Thus, it is possible to prevent reduction in an output voltage of the inverter circuit (3).

As another option, the phase current detection device may be configured to cyclically select the voltage vectors V1, V2, and V4. Thus, offset detection can be regularly performed. By regularly performing offset detection in the above-described manner, offset compensation according to fluctuations of the offset amount due to temperature change, etc. can be performed.

Other Embodiments

Note that the carrier frequency and the cycle of insertion of the phase current detection period (T1) shown in each of the above-described embodiments and variations are merely examples. Values for the carrier frequency and the cycle of insertion of the phase current detection period (T1) can be appropriately selected in consideration of application purposes.

The wide bandgap semiconductor used for the switching elements (Sup, . . . , Swn) is also an example, and the switching elements are not limited thereto. Switching elements may be appropriately selected in consideration of the carrier frequency (switching frequency) etc.

In the inverter circuit (3), external free wheel diodes (Dup, . . . , Dwn) may be omitted, and so-called synchronous rectification may be performed.

In the detection section (5), detection (A/D conversion) does not necessarily have to be completed in the phase current detection period (T1). For example, the detection section (5) may be configured to include a sample and hold circuit so that the voltage value is held in the phase current detection period (T1) and detection (A/D conversion) is completed in the inverter control period (T2). That is, basically, a detection result does not necessarily have to be output in the phase current detection period (T1), and only a voltage value of a voltage pulse in the phase current detection period (T1) has to be detected.

INDUSTRIAL APPLICABILITY

The present invention is useful as a phase current detection device for detecting a phase current of an output alternating current of an inverter circuit, and a power conversion device using the phase current detection device, etc.

DESCRIPTION OF REFERENCE CHARACTERS

1 Phase current detection device
2 Converter circuit (direct current power source)
3 Inverter circuit
4 Control section
5 Detection section
6 Motor (load)
10 Power conversion device
leg1 Switching leg
leg2 Switching leg
leg3 Switching leg
M1, M2, M3 Intermediate point
N, P Direct current bus line (N)
R, R1, R2, R3 Shunt resistor
Sup, . . . , Swn Switching element
T1 Phase current detection period
T2 Inverter control period

The invention claimed is:

1. A phase current detection device for detecting a phase current of an output alternating current in an inverter circuit which converts a direct current into an alternating current by changing respective switching states of a plurality of switching elements, the device comprising:
   a shunt resistor configured to output a voltage pulse of a voltage corresponding to the phase current;
   a control section configured to change each of the switching states of the switching elements so that inverter control for controlling a current or a voltage generated by the output alternating current is repeated in units of an inverter control period having a predetermined length; and
   a detection section configured to detect the phase current based on the voltage pulse,
   wherein
   the control section controls the switching states of the switching elements so that a phase current detection period, in which the phase current is detected, is provided between the predetermined inverter control periods, and a voltage pulse is output from the shunt resistor in the phase current detection period, the voltage pulse in the phase current detection period having a larger width than a width of the voltage pulse in the inverter control period, and
   the detection section detects the phase current using a voltage pulse in the phase current detection period.

2. The phase current detection device of claim 1, wherein the phase current detection period is longer than the inverter control period.

3. The phase current detection device of claim 1, wherein the shunt resistor is provided between a negative direct current bus line in the inverter circuit and a direct current power source which outputs the direct current.

4. The phase current detection device of claim 1, wherein the plurality of switching elements form a plurality of switching legs so that each of the switching legs includes two of the switching elements, which are connected together in series,
   each of the switching legs is connected between positive and negative direct current bus lines in the inverter circuit, and each of respective intermediate points of the switching legs is connected to a load, and
   the shunt resistor is provided in each of the switching legs.

5. A power conversion device including the phase current detection device of claim 1, comprising:
   an inverter circuit which converts a direct current into an alternating current by changing respective switching states of a plurality of switching elements;
   wherein
   each of the switching elements is made of wide bandgap semiconductor.

* * * * *